United States Patent
Kim

(10) Patent No.: US 8,263,461 B2
(45) Date of Patent: Sep. 11, 2012

(54) LATERAL DOUBLE DIFFUSED METAL OXIDE SEMICONDUCTOR

(75) Inventor: Mi Young Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 424 days.

(21) Appl. No.: 12/643,631

(22) Filed: Dec. 21, 2009

(65) Prior Publication Data

US 2010/0163984 A1 Jul. 1, 2010

(30) Foreign Application Priority Data

Dec. 31, 2008 (KR) .................. 10-2008-0138215

(51) Int. Cl.
*H01L 21/8236* (2006.01)
*H01L 29/66* (2006.01)
(52) U.S. Cl. ................ 438/276; 257/328; 257/335
(58) Field of Classification Search .......... 438/212, 438/276, 533, 546; 257/328, 335, E21.626, 257/E21.64
See application file for complete search history.

(56) References Cited

U.S. PATENT DOCUMENTS

| 6,046,474 A * | 4/2000 | Oh et al. ............... 257/343 |
| 6,900,101 B2 * | 5/2005 | Lin ........................ 438/276 |
| 7,875,929 B2 * | 1/2011 | Ko ......................... 257/342 |

* cited by examiner

*Primary Examiner* — Calvin Lee
(74) *Attorney, Agent, or Firm* — The Law Offices of Andrew D. Fortney; Andrew D. Fortney

(57) ABSTRACT

Disclosed are lateral double diffused metal oxide semiconductor (LDMOS) transistors having a uniform threshold voltage and methods for manufacturing the same. The methods include forming a polysilicon layer over the semiconductor substrate including a shallow trench isolation region, etching a portion of the polysilicon layer over an active region, implanting first conductive-type impurity ions using the polysilicon layer as a mask to form a first conductive-type body region, implanting second conductive-type impurity ions using the polysilicon layer as a mask to form a second conductive-type channel region in the first conductive-type body region, removing the polysilicon layer, forming gate electrodes in the polysilicon-free region, and forming a source region and a drain region in the first conductive-type body region using the gate electrode and the shallow trench isolation as ion-implantation masks.

10 Claims, 4 Drawing Sheets

After patterning    After body-implanting

LATERAL DOUBLE DIFFUSED METAL OXIDE SEMICONDUCTOR

This application claims the benefit of Korean Patent Application No. 10-2008-0138215, filed on Dec. 31, 2008 which is hereby incorporated by reference as if fully set forth herein.

BACKGROUND OF THE INVENTION

1. Field of the Invention

The present disclosure relates to a semiconductor technique. More specifically, the present disclosure relates to a lateral double diffused metal oxide semiconductor (LDMOS) transistor to realize uniform threshold voltage.

2. Discussion of the Related Art

The improvement in integration level of semiconductor devices, and thus development in fabrication design techniques thereof, has brought about a number of efforts to realize a semiconductor system on a single chip. Such a single chip system has been developed, based on technology to integrate controllers, memories and circuits operating at low voltages onto a single chip.

However, to realize low weight and miniaturization of a semiconductor system, it is necessary to integrate a circuit to control power of the system (e.g., input and output terminals and main functional circuits) onto a single chip. However, input and output terminals generally cannot be realized as a low-voltage CMOS circuit, because high voltages may be applied thereto. Accordingly, these terminals may be generally realized by high-voltage power transistors.

To reduce the size and weight of systems, input/output terminals of a power source and a controller should be integrated into a single chip. A technology to realize this integration is a power IC, wherein a high-voltage transistor circuit and a low-voltage CMOS transistor circuit are integrated into a single chip.

Such a power IC technology is an improvement of a vertical DMOS (VDMOS) device, a related art discrete power transistor, which may realize a lateral DMOS (LDMOS) device. In a LDMOS device, the drain is laterally arranged to allow current to laterally flow and the drift region is interposed between a channel and the drain to assure high voltage breakdown.

However, in accordance with a general LDMOS technology, photoresist used to form p-type body regions typically undergoes a variation in its profile when ions are implanted. That is, as shown in FIG. 1, after ion-implantation to form p-type body regions, the profiles of the photoresist are varied, thus causing unbalance between left and right photoresist profiles, which results in non-uniformity between channel lengths, leading to deterioration in transistor characteristics. This non-uniformity between left and right channel lengths causes a transistor with the shorter channel to turn on earlier, as compared to another transistor with a longer channel. This means that the transistor with the shorter channel has a lower threshold voltage than a target threshold voltage, thus causing a non-uniform threshold voltage across different devices.

SUMMARY OF THE INVENTION

Accordingly, the present invention is directed to a lateral double diffused metal oxide semiconductor (LDMOS) transistor that substantially obviates one or more problems due to limitations and disadvantages of the related art.

It is one object of the present invention to provide a lateral double diffused metal oxide semiconductor (LDMOS) transistor to realize a uniform threshold voltage.

To achieve these objects and other advantages and in accordance with the purpose(s) of the invention as embodied and broadly described herein, provided is a method for manufacturing a lateral double diffused metal oxide semiconductor transistor, including forming a polysilicon layer over the entire surface of a semiconductor substrate including first and second shallow trench isolation (STI) regions, the STI regions defining an active region and a device-isolation region, etching a portion of the polysilicon layer over an active region, implanting first conductive-type impurity ions using the etched polysilicon layer as a mask to form a first conductive-type body region, implanting second conductive-type impurity ions using the etched polysilicon as a mask to form a second conductive-type channel region in the first conductive-type body region, removing the etched polysilicon layer, forming first and second polysilicon gate electrodes, forming a source region in the first conductive-type body region, and forming first and second drain regions in the semiconductor substrate using the gate electrodes and the shallow trench isolation regions as ion-implantation masks.

In a second aspect, the present invention provides a pair of lateral double diffused metal oxide semiconductor transistors, comprising first and second device isolation regions in semiconductor substrate; a first conductive-type body region in the semiconductor substrate; a second conductive-type channel region in the first conductive-type body region, where the distance between an edge of the second conductive-type channel region and an edge of the first conductive-type body is uniform; first and second gate electrodes, where a distance between an edge of the first gate electrode and a nearest edge of the second conductive-type channel region is substantially the same as a distance between an edge of the second gate electrode and a nearest edge of the second conductive-type channel region; a source region in the first conductive-type body region; and first and second drain regions in the semiconductor substrate.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle(s) of the invention. In the drawings.

DETAILED DESCRIPTION OF THE INVENTION

Hereinafter, embodiments of the present invention will be described with reference to the appended drawings. Although the configurations and functions of embodiments of the present invention are illustrated in the accompanying drawings, in conjunction with at least one embodiment, and described with reference to the accompanying drawings and the embodiment(s), the technical idea of the present invention and the important configurations and functions thereof are not limited thereto.

Although most terms used in the present disclosure have been selected from general ones widely used in the art, some terms have been arbitrarily selected, and their meanings are explained in detail in the following description as needed. Thus, the present disclosure should be understood with the intended meanings of the terms, rather than their simple names or meanings.

The technical objects and features of embodiments of the present invention will be more clearly understood by those skilled in the art from the following detailed description. Hereinafter, a lateral double diffused metal oxide semiconductor (LDMOS) transistor to realize a uniform threshold voltage according to embodiments of the present invention will be described with reference to the appended drawings.

FIGS. 2A to 2G are cross-sectional views illustrating structures formed in an exemplary method for fabricating a lateral double diffused metal oxide semiconductor transistor according to embodiments of the present invention.

Figure 1:
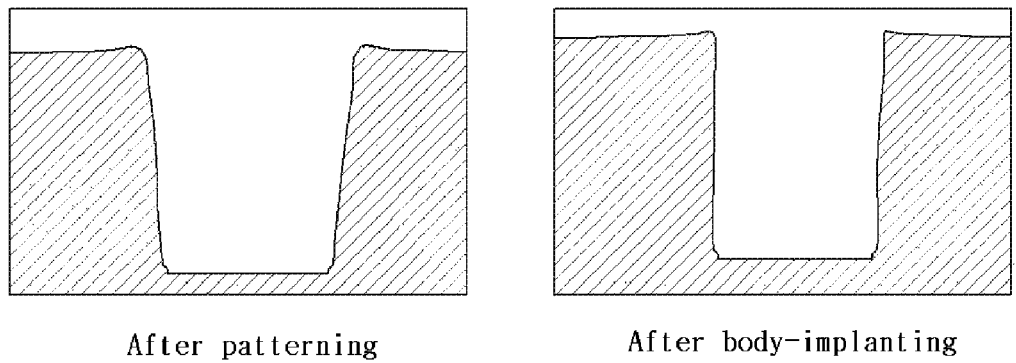
FIG. 1 illustrates a variation in profiles of a photoresist mask used in a method of forming a lateral double diffused metal oxide semiconductor transistor.
Figure 2A:
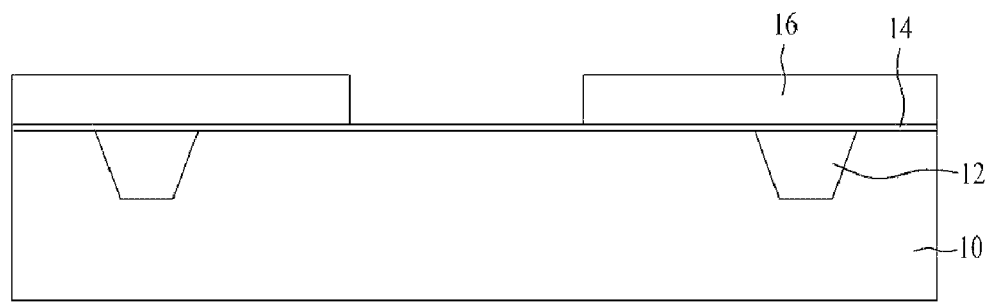
FIGS. 2A to 2G are cross-sectional views illustrating structures formed in an exemplary method for fabricating a lateral double diffused metal oxide semiconductor transistor according to various embodiments.

First, as shown in FIG. 2A, one or more trenches are formed in a corresponding number of device-isolation region (s) of a semiconductor substrate 10 which may comprise a monocrystalline silicon wafer. Substrate 10 includes an active region and the device-isolation region(s). The trenches may be formed using a pad oxide pattern (not shown) and a pad nitride film (not shown) thereon as an etching mask, and the STI structures 12 are formed by depositing an insulating film over the entire surface of the semiconductor substrate 10 (e.g., by CVD, PECVD, etc. of a dielectric material such as $SiO_2$, TEOS, etc.) and then planarizing the insulating film by chemical mechanical polishing (CMP). The shallow trench isolation (STI) regions 12 define the active region(s) and the device-isolation region(s) of the semiconductor substrate 10. Then, a gate oxide film 14 is formed over the entire surface of the semiconductor substrate 10 provided with the shallow trench isolation regions 12. A gate electrode is to be formed on the gate oxide film 14 in a subsequent process. Generally, gate oxide film 14 is formed by wet or dry thermal oxidation of the surface of substrate 10.

Then, polysilicon layer 16 is formed over the entire surface of the semiconductor substrate 10 including the gate oxide film 14, and a portion of the polysilicon layer 16 is masked and etched by photolithographic patterning. The patterned polysilicon layer 16 serves as a mask to form a p-type body region and an n-type channel region in the following process. The patterned polysilicon layer 16 is used instead of a photoresist, thus causing no variation in mask profile during implantation. In addition, the polysilicon layer 16 serves as a hardmask, and a polysilicon gate electrode is formed in a subsequent process.

Figure 2B:
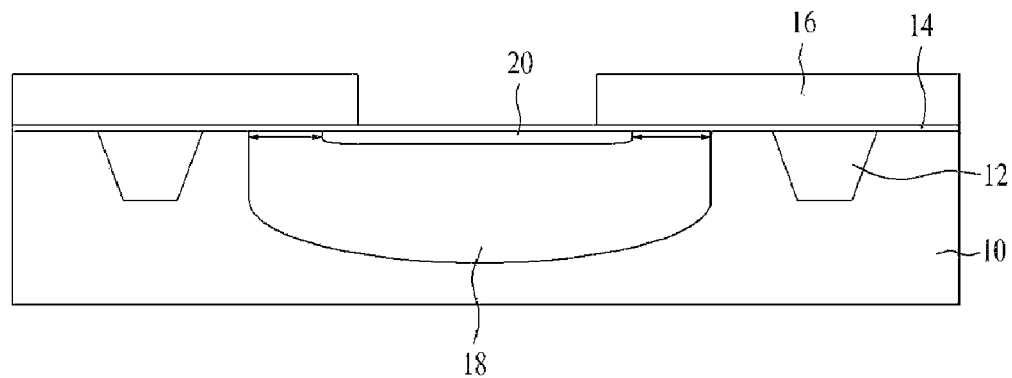

Then, as shown in FIG. 2B, p-type impurity ions are implanted in a predetermined dose (e.g., from $1 \times 10^{15} \sim 1 \times 10^{18}$ atoms/cm$^2$, or any value therein) using the polysilicon hard mask 16 as an ion-implantation mask. The impurity ions are diffused at a predetermined temperature (e.g., from 800-1200° C., or any value therein) for a given period (e.g., from 1 minute to 6 hours, or any value therein) to form a p-type body region 18. Then, in the same manner as in the p-type body region 18, n-type impurity ions are implanted using the polysilicon hard mask 16 as a mask to form an n-type channel region 20 on the uppermost surface of the p-type body region 18.

Figure 2C:
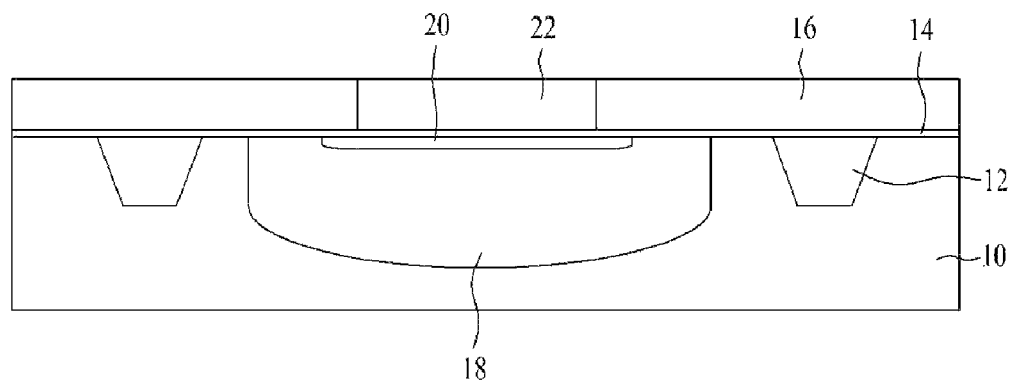

Then, as shown in FIG. 2C, an oxide film 22 is formed over the entire surface of the resulting structure and in the space between adjacent polysilicon mask structures 16. Oxide film 22 may be formed by, e.g., CVD, PECVD, etc. of a dielectric material such as $SiO_2$, TEOS, etc. In addition, the oxide film 22 is planarized by chemical mechanical polishing (CMP) until the polysilicon layer 16 is exposed.

Figure 2D:
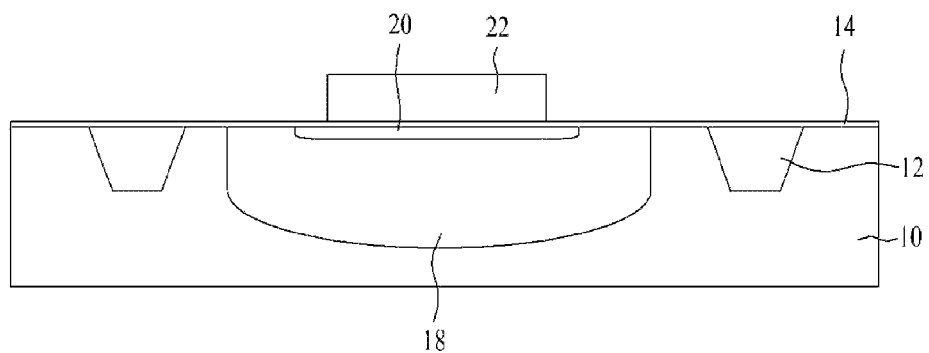

Then, as shown in FIG. 2D, dry-etching (e.g., RIE or plasma etching) is performed on the resulting structure to selectively remove the polysilicon layer 16. At this time, the oxide film 22 is not removed due to the difference in etching selectivity between the polysilicon layer 16 and the oxide film 22. For example, selective etching of polysilicon layer 16 may be performed by employing chlorine-based or bromine-based gases (e.g., HCl, $Cl_2$, HBr, $Br_2$, or a combination thereof) in a RIE or plasma etching process.

Figure 2E:
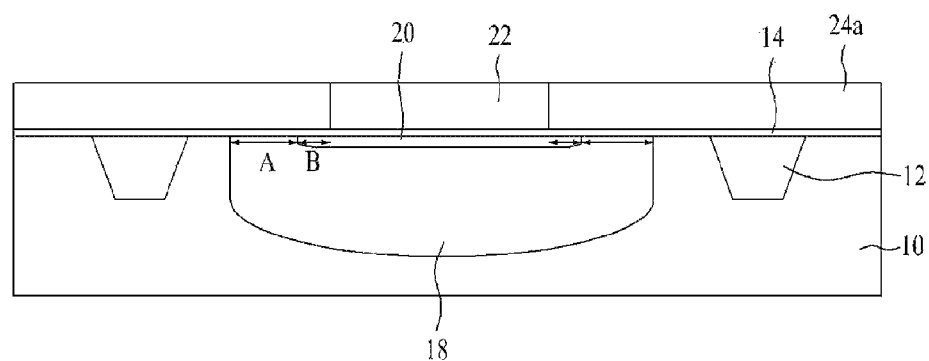

Then, as shown in FIG. 2E, a gate electrode material is deposited over the entire surface of the semiconductor substrate 10, including the oxide film 22, and is then planarized by CMP until the oxide film 22 is exposed such that the gate electrode material 24a remains on the gate oxide film 14. At this time, the gate electrode material 24a is arranged at the same position as the removed polysilicon layer 16, and the lengths of wells arranged under the gate electrode material 24a are identical to one another, as shown by arrows A and B in FIG. 2E. Alternatively, the steps discussed with respect to FIGS. 2D-2E may be omitted.

Figure 2F:
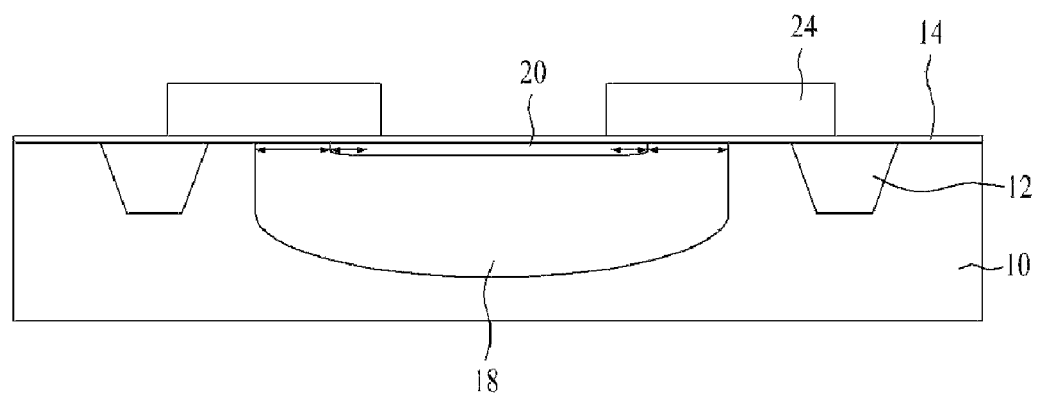

Then, as shown in FIG. 2F, the oxide film 22 between the gate electrode material 24a is selectively removed by wet-etching using, e.g., hydrofluoric acid (which may be buffered with, e.g., ammonia and/or ammonium fluoride). At this time, the gate electrode material 24a still remains due to the difference in etching selectivity between silicon dioxide and silicon. Then, the gate electrode material 24a is patterned to form gate electrodes 24. At this time, the gate electrode material 24a is patterned, such that the one end of each of the gate electrodes 24 extends to the surface of the p-type body region 18 and the other end thereof extends on the shallow trench isolation regions 12. In one embodiment, the photoresist mask (not shown) also covers the exposed region above p-type body region 18 and n-type channel region 20.

Figure 2G:
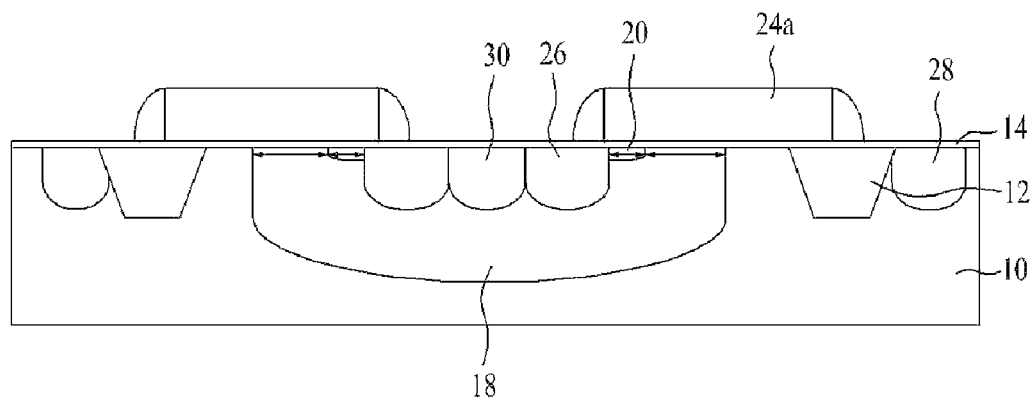

Then, n-type impurity ions are implanted in the exposed p-type body region 18 using the gate electrodes 24 and the shallow trench isolation regions 12 as ion-implantation masks to form source regions 26 and drain regions 28 to a predetermined depth (see, e.g., FIG. 2G). At this time, a source contact region 30 comprising p-type impurity ions is formed by, e.g., ion-implantation adjacent to the source region 26.

As apparent from the foregoing description, in accordance with embodiments of the present invention, not only the p-type body region and the n-type channel region, but also the gate electrodes arranged thereon are formed in a self-aligned manner using polysilicon as a hardmask instead of a photoresist whose profile may vary during implantation. Accordingly, the area of the n-type channel region and p-type body region to be diffused under the gate electrodes is uniform. For this reason, the threshold voltage of a LDMOS transistor can be stable and the source voltage thereof can be uniform.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A method for manufacturing a lateral double diffused metal oxide semiconductor transistor, comprising:

forming a polysilicon layer over the entire surface of a semiconductor substrate, including first and second shallow trench isolation regions that define one or more active regions and a plurality of device-isolation regions;

etching a portion of the polysilicon layer over one of said active region(s);

implanting first conductive-type impurity ions using the polysilicon layer as a mask to form a first conductive-type body region;

implanting second conductive-type impurity ions using the polysilicon layer as a mask to form a second conductive-type channel region in the first conductive-type body region;

removing the polysilicon layer;

forming first and second gate electrodes;

forming a source region in the first conductive-type body region; and forming first and second drain regions in the semiconductor substrate.

2. The method according to claim 1, wherein the first conductive-type impurity is a p-type impurity, and the second conductive-type impurity is an n-type impurity.

3. The method according to claim 1, wherein forming the first and second gate electrodes comprises:

forming an oxide film over the entire surface of the etched polysilicon layer and in a space in the polysilicon layer;

planarizing the resulting structure until the etched polysilicon layer is exposed;

etching the resulting structure to remove only the polysilicon layer;

forming a gate electrode layer;

removing the oxide film by etching; and patterning the gate electrode layer to form the first and second gate electrodes.

4. The method according to claim 3, wherein etching the polysilicon comprises dry-etching.

5. The method according to claim 3, wherein etching the oxide film comprises wet-etching using hydrofluoric acid.

6. The method according to claim 3, wherein a distance between an edge of the second conductive-type channel region and an edge of the first conductive-type body region is uniform.

7. The method according to claim 1, wherein a distance between an edge of the first gate electrode and a nearest edge of the second conductive-type channel region is substantially the same as a distance between an edge of the second gate electrode and a nearest edge of the second conductive-type channel region.

8. The method according to claim 1, wherein one end of the first gate electrode extends over a surface of the second conductive-type channel region, and an opposite end of the first gate electrode extends over the first shallow trench isolation region, and the second gate electrode extends over a surface of the second conductive-type channel region, and an opposite end of the second gate electrode extends over the second shallow trench isolation region.

9. The method according to claim 1, further comprising implanting first conductive-type impurity ions adjacent to the source region to form a source contact region.

10. The method according to claim 1, further comprising forming a gate oxide film over the entire surface of the semiconductor substrate prior to formation of the polysilicon layer.

* * * * *